US012648466B2

(12) United States Patent
     Pulvermüller et al.

(10) Patent No.: US 12,648,466 B2
(45) Date of Patent: Jun. 2, 2026

(54) ELECTRONIC CIRCUIT

(71) Applicant: STMicroelectronics (Grenoble 2) SAS, Grenoble (FR)

(72) Inventors: Corine-Christine Pulvermüller, St Egreve (FR); Pierre Airault, Moirans (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 437 days.

(21) Appl. No.: 18/344,253

(22) Filed: Jun. 29, 2023

(65) Prior Publication Data

US 2024/0006329 A1      Jan. 4, 2024

(30) Foreign Application Priority Data

Jun. 30, 2022    (FR) ...................................... 2206624

(51) Int. Cl.
     *H01L 23/538* (2006.01)
     *H01L 23/48* (2006.01)
     *H01L 23/528* (2006.01)
     *H01L 23/535* (2006.01)

(52) U.S. Cl.
     CPC ........ *H01L 23/5386* (2013.01); *H01L 23/481* (2013.01); *H01L 23/5286* (2013.01); *H01L 23/535* (2013.01)

(58) Field of Classification Search
     CPC ............... H01L 23/5386; H01L 23/481; H01L 23/5286; H01L 23/535
     See application file for complete search history.

(56) References Cited

U.S. PATENT DOCUMENTS

| | | | |
|---|---|---|---|
| 8,336,018 B2 | 12/2012 | Turner et al. | |
| 2019/0172795 A1 | 6/2019 | Sabouret et al. | |
| 2019/0213298 A1* | 7/2019 | Correale, Jr. ....... | H01L 23/5286 |
| 2022/0102278 A1 | 3/2022 | Peng et al. | |

FOREIGN PATENT DOCUMENTS

EP             2395444  A1    12/2011

* cited by examiner

*Primary Examiner* — Herve-Louis Y Assouman
(74) *Attorney, Agent, or Firm* — Slater Matsil, LLP

(57)                    ABSTRACT

In an embodiment an electronic circuit includes a first grid configured to be biased with a potential different from ground, the first grid including conductive tracks arranged in a first level of the electronic circuit and conductive tracks arranged in a second level of the electronic circuit, wherein the first grid is configured to power a first circuit at least partially implemented in a level arranged below the first and second levels, and wherein the conductive tracks are arranged in the first level extending along a first direction and being separated from one another by spacings and a conductive rail coupling a first node and a second circuit by crossing the first grid, wherein the conductive rail is insulated from the first grid and configured to be biased with a potential different from the ground, and wherein the conductive rail includes conductive tracks arranged in the first level of the electronic circuit along the first direction and in the spacings of the conductive tracks.

20 Claims, 5 Drawing Sheets

ELECTRONIC CIRCUIT

CROSS-REFERENCE TO RELATED APPLICATIONS

This application claims the benefit of French Patent Application No. 2206624, filed on Jun. 30, 2022, which application is hereby incorporated herein by reference.

TECHNICAL FIELD

The present disclosure relates to electronic circuits.

BACKGROUND

Current electronic circuits may comprise arrangements of conductive tracks to couple, for example, one or a plurality of electric power supplies to analog or digital circuits of the electronic circuit while trying to minimize ohmic losses.

When the electronic circuit comprises a plurality of isolated electric power supplies, there is a technical difficulty in introducing additional power supply rails without increasing the occupied surface area of the circuit.

SUMMARY

Embodiments provide electronic circuits where the global footprint of the arrangements of conductive tracks extends over smaller surface areas.

Embodiments overcome all or part of the disadvantages of known electronic circuits.

An embodiment provides an electronic circuit comprising:

a first grid, configured to be biased with a potential different from ground, comprising conductive tracks arranged in a first level of the electronic circuit and conductive tracks arranged in a second level of the electronic circuit, the first grid being arranged to power a first circuit at least partially implemented in a level arranged under the first and second levels; the conductive tracks arranged in the first level extending along a first direction and being separated from one another by spacings; and a conductive rail coupling a first node and a second circuit by crossing the first grid, the conductive rail being insulated from the first grid and configured to be biased with a potential different from ground, and comprising conductive tracks arranged in the first level of the electronic circuit along the first direction and in said spacings of the tracks of the first grid arranged in the first level.

An embodiment provides an electronic circuit manufacturing method comprising:

the forming of a first grid, configured to be biased with a potential different from ground, and comprising conductive tracks arranged in a first level of the electronic circuit and conductive tracks arranged in a second level of the electronic circuit, the first grid being arranged to power a first circuit at least partially implemented in a level arranged under the first and second levels, the conductive tracks arranged in the first level extending along a first direction and being separated from one another by spacings; and the forming of a conductive rail coupled between a first node and a second circuit by crossing the first grid, insulated from the first grid and configured to be biased with a potential different from ground, and comprising conductive tracks arranged in the first level of the electronic circuit along the first direction and in said spacings of the tracks of the first grid arranged in the first level.

An embodiment provides an electronic circuit comprising:

a first grid, configured to be grounded, comprising conductive tracks arranged in a first level of the electronic circuit and conductive tracks arranged in a second level of the electronic circuit, the first grid being arranged to power a first circuit at least partially implemented in a level arranged under the first and second levels;

the conductive tracks arranged in the first level extending along a first direction and being separated from one another by spacings; and a conductive rail coupling a first node and a second circuit by crossing the first grid, the conductive rail being insulated from the first grid and configured to be grounded, and comprising conductive tracks arranged in the first level of the electronic circuit along the first direction and in said spacings of the conductive tracks of the first grid arranged in the first level.

In an embodiment, the second circuit is an analog circuit of the electronic circuit.

In an embodiment, the conductive rail is coupled to the analog circuit via one or a plurality of switches configured to control the flowing of current between the conductive rail and the analog circuit.

In an embodiment, the analog circuit is coupled to a terminal of the switch(es) formed in another level of the electronic circuit different from the first level and from the second level;

another terminal of the switch(es) being coupled to the tracks of the conductive rail.

In an embodiment, the conductive tracks of the first grid, arranged in the first level, are coupled via one or a plurality of vias to the conductive tracks of the first grid arranged in the second level; and the conductive tracks of the conductive rail arranged in the first level are coupled via one or a plurality of vias to conductive tracks of the conductive rail arranged in the second level.

In an embodiment, the conductive tracks of the first grid arranged in the second level extend along a second direction, transverse to the first direction, and are coupled via one or a plurality of vias to the conductive tracks of the first conductive grid arranged in the first level.

In an embodiment, the electronic circuit comprises a second grid, configured to be grounded when the first grid is biased with a potential different from ground or configured to be biased to a potential different from ground when the first grid is grounded, the second grid comprising conductive tracks arranged in the first level, which extend along the first direction in the spacings between the conductive tracks of the first grid arranged in the first level along the first direction, the second grid comprising conductive tracks arranged in the second level of the electronic circuit, which extend along the second direction;

the conductive tracks of the second grid arranged in the first level being coupled to the conductive tracks of the second grid arranged in the second level by vias.

In a second embodiment, the conductive tracks of the first and of the second grid and of the conductive rail, arranged in the first level, have a thickness greater than the conductive tracks of the first and of the second grid and of the conductive rail arranged in the second level.

In an embodiment, the conductive tracks of the first and second grids and of the conductive rail are made of copper.

In an embodiment, one of the conductive tracks of the conductive rail closest to the analog circuit is coupled to a power supply configured to deliver said potential different from ground via a power supply pad.

In an embodiment, one of the conductive tracks of the conductive rail most distant from the analog circuit is coupled to a power supply configured to deliver said potential different from ground via the node.

In an embodiment, the resistance of the conductive rail is in the range from 0.4 to 1.5 ohms.

An embodiment provides a microcontroller comprising such a circuit.

BRIEF DESCRIPTION OF THE DRAWINGS

The features and advantages, as well as others, will be described in detail in the rest of the disclosure of specific embodiments given by way of illustration and not limitation with reference to the accompanying drawings, in which.

DETAILED DESCRIPTION OF ILLUSTRATIVE EMBODIMENTS

Similar features have been designated by similar references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
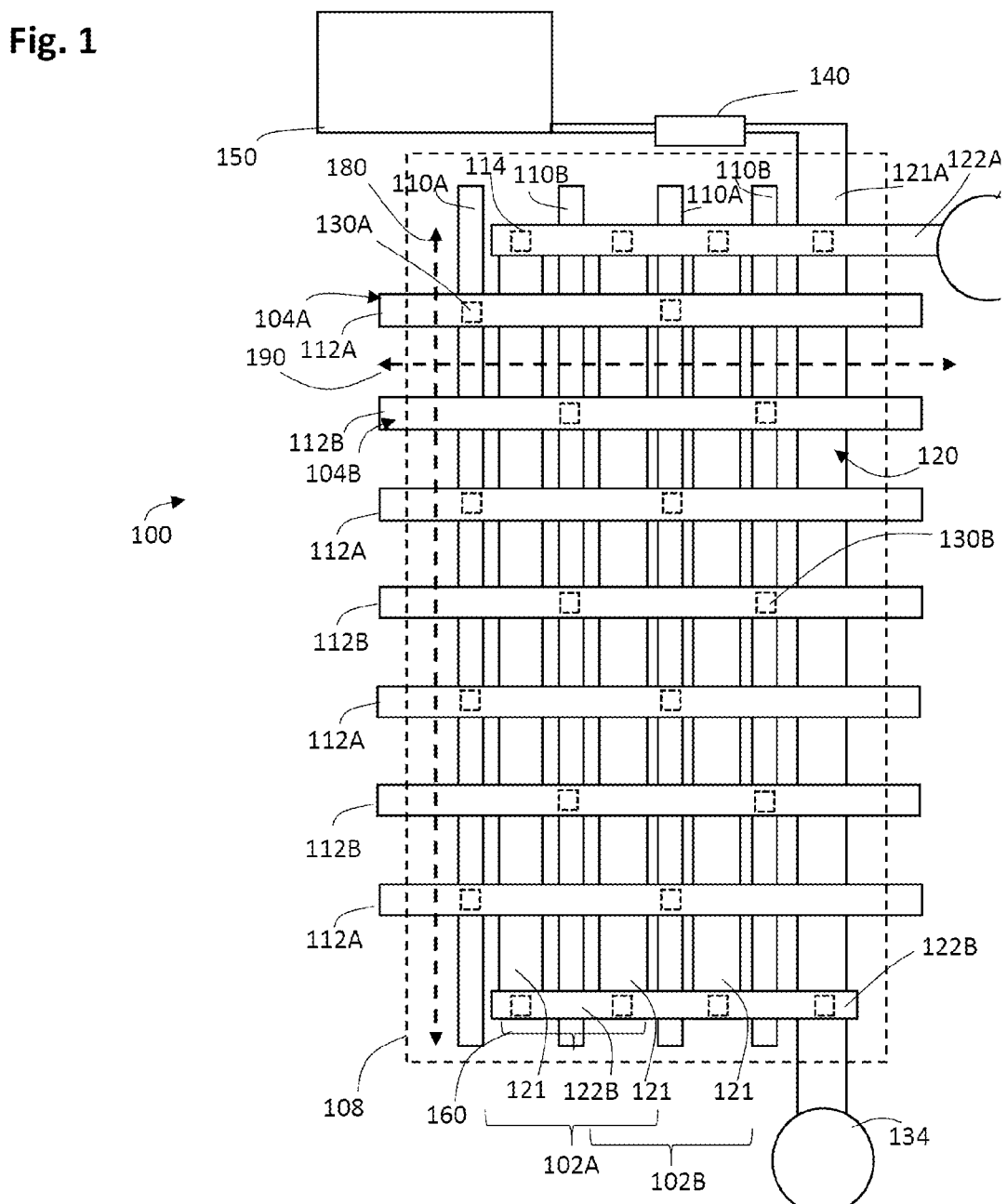
FIG. 1 is a simplified bottom view of an electronic circuit according to an embodiment of the present disclosure.

FIG. 1 is a simplified bottom view of an electronic circuit 100 according to an embodiment of the present disclosure.

The electronic circuit 100 of FIG. 1 comprises a first grid 104A, configured to be biased with a potential different from ground or in another example to ground. First grid 104A comprises conductive tracks 110A arranged in at least a first level of electronic circuit 100 and conductive tracks 112A arranged in at least a second level of electronic circuit 100. The levels of electronic circuit 100 correspond to levels of stacked metal tracks separated from one another by an insulator, for example, a dielectric of low electric permittivity or silicon dioxide. Tracks 110A, 112A of the different levels are for example connected together by vias 130A which pass through the insulator. Vias 130A are for example arranged at the level where tracks 110A and 112A face each other. In the example of FIG. 1, only the metal conductive tracks are shown, without the insulator. In the example of FIG. 1, two conductive tracks 110A of the first level are arranged along a vertical direction and four conductive tracks 112A of the second level are arranged along a horizontal direction. These numbers are examples only, and the numbers of tracks may be, in practice, greater for example than several hundreds or thousands. In another example, conductive tracks 110A are arranged along first direction 180 which is vertical and conductive tracks 112A are arranged along second direction 190, which is horizontal. In an example, the tracks of the first level and of the second level are arranged along perpendicular directions. In another example, the tracks of the first level and of the second level are arranged along non-perpendicular directions.

First grid 104A is arranged, for example, to power, through a plurality of vias, a circuit 108 at least partially implemented in a level arranged under the first and second levels, circuit 108 being for example a digital circuit.

The electronic circuit 100 of FIG. 1 may optionally comprise a second grid 104B insulated from first grid 104A. Second grid 104B is for example configured to be biased with a potential different from ground if first grid 104A is grounded or, in another example, grounded if the first grid is biased with a potential different from ground. These different biasing are for example obtained with a power supply (not illustrated), belonging to circuit 100 or external to circuit 100. Second grid 104B comprises conductive tracks 110B arranged, for example, in the first level of electronic circuit 100 and conductive tracks 112B arranged, for example, in the second level of electronic circuit 100. The tracks 110B, 112B of the different levels are for example coupled together by vias 130B which cross the insulator. Vias 130B are for example arranged at the level where tracks 110B and 112B face each other. In the example of FIG. 1, two conductive tracks 110B of the first level are arranged along a vertical direction and three conductive tracks 112B of the second level are arranged along a horizontal direction. These numbers are examples, and the numbers of tracks may be, in practice, greater for example than several hundreds or thousands. In another example, conductive tracks 110B are arranged in first direction 180 which is vertical and conductive tracks 112B are arranged along the second direction 190 which is horizontal. In the example of FIG. 1, the tracks 112B of second grid 104B are arranged in the second level between the tracks 112A of first grid 104A, which are also arranged in the second level. In an example, the conductive tracks 110A of first grid 104A, arranged in the first level, are separated from one another by spacings 102A. In an example, the vertical tracks 110B of second grid 104B are arranged in spacings 102A. In other words, the vertical tracks 104B of the second grid are arranged between two vertical tracks 110A of first grid 104A. Spacings 102A for example comprise the insulator in addition to other conductive tracks. Similarly, the conductive tracks 110B of second grid 104B, arranged in the first level, are separated from one another by spacings 102B. In an example, the vertical tracks 110A of the first grid 104A are arranged in spacings 102B. In other words, the vertical tracks 104A of the first grid are arranged between two vertical tracks 110B of first grid 104B. Spacings 102B for example comprise the insulator in addition to other conductive tracks. In an example, spacings 102A are equal to spacings 102B.

In an example, the tracks of the second grid 104B of the first level and of the second level are arranged along perpendicular directions. In another example, not illustrated, the tracks of the first level and of the second level are arranged along non-perpendicular directions.

In an alternative example, not illustrated, the levels having the tracks of the first and second grids arranged therein are inverted with respect to the example of FIG. 1.

In an example, second grid 104B is coupled to digital circuit 108 to power it.

The electronic circuit 100 of FIG. 1 also comprises a conductive rail 120 coupling a first node 134, which is for example a power supply pad, and a circuit 150, for example, analog and/or belonging for example to the electronic circuit, by crossing first grid 104A and optionally, if second grid 104B is present, by also crossing second grid 104B. The fact for conductive rail 120 to cross one or a plurality of grids for example implies that this rail crosses an area delimited by the periphery of the grids. Conductive rail 120 is insulated from first grid 104A and from second grid 104B, for example by an insulator. Conductive rail 120 is for example biased with a power supply (not illustrated), belonging to circuit 100 or external to circuit 100, and for example coupled to node 134, with a potential different from ground or, in another example, grounded.

In certain cases, electronic circuit 100 also comprises a second node 132, which is for example a power supply pad, coupled to circuit 150 by a portion of conductive rail 120. Indeed, power supply pad 132 is for example provided to be arranged at closest to analog circuit 150 so that the electric path has a low resistivity. However, providing a power supply pad, such as pad 132, close to the circuit 150 to be powered is not always possible, and in certain cases, even if pad 132 is present, it is not accessible or usable. Conductive rail 120 is thus provided to enable to couple circuit 150 to power supply pad 134, which is relatively far from circuit 150, in relatively lightly resistive fashion, and consuming little surface area.

Conductive rail 120 comprises conductive tracks 121, 121A arranged in the first level of electronic circuit 100 along the first vertical direction 180 and in spacings 102A and/or 102B. In another example, not illustrated in FIG. 1, the conductive tracks 110A of first grid 104A are arranged, for example, on each side of the vertical tracks 121 of conductive rail 120. Two adjacent vertical tracks 110A of first grid 104A are thus separated, in the corresponding spacing 102A, by at least one of the tracks 121 of conductive rail 120.

In the example of FIG. 1, two vertical tracks 121 of conductive rail 120 are arranged in each spacing 102A. In this example, an assembly 160 comprising two first vertical tracks 121 of conductive rail 120 separated by a vertical track 110B of second grid 104B, is arranged in at least one spacing 102A. In the example of FIG. 1, the number of tracks 110A is equal to 2, and there is thus a single spacing 102A. In another example not illustrated where the number of tracks 110A is equal to or greater than 3, an assembly 160 is arranged in each spacing 102A.

In another example, where second grid 104B is not present, assembly 160 then comprises one or a plurality of vertical tracks 121 arranged in each spacing 102A. In particular, the assembly may comprise a single track 121, or more than two vertical tracks.

In the example of FIG. 1, four vertical tracks 121 are shown, although in other embodiments there may be two or three vertical tracks 121, or more than four vertical tracks 121. Tracks 121 extend, for example, in first direction 180. Conductive rail 120 comprises, in the example of FIG. 1, conductive tracks 122A, 122B arranged in the second level of electronic circuit 100 along the horizontal direction. Conductive tracks 122A, 122B are for example coupled to tracks 121 by vertical vias 114 and located at the intersections between the tracks of the first level and the tracks of the second level. In another example, the tracks of conductive rail 120 arranged in the first level and in the second level are oriented non-perpendicularly between each level. In another example, not illustrated, the levels where the tracks 121, 122A, 122B of conductive rail 120 are arranged are inverted with respect to the illustrated example. In still another example, not illustrated, power supply pad 134 is connected to any of conductive tracks 121, or to track 122B.

In the example of FIG. 1, the conductive tracks 122A, 122B of conductive rail 120 are arranged in second direction 190 and parallel to the tracks 112A of first grid 104A and, if it is present, to the tracks 112B of second grid 104B. In another example, the conductive tracks 122A, 122B of conductive rail 120 are arranged along a direction different from that of the tracks 112 of first grid 104A and/or of second grid 104B if it is present. In another example, not illustrated, the conductive tracks 122A, 122B of conductive rail 120 are arranged on either side of an area where tracks 112A, and possibly 112B, are present. In another example, not illustrated, the conductive tracks 122A, 122B of conductive rail 120 are arranged in spacings located between tracks 112A and/or 112B.

In the example of FIG. 1, conductive track 122A is for example positioned at the level of an end of conductive tracks 121 which is closest to analog circuit 15o. Conductive track 122A is for example connected to node 132. This node is configured to be optionally connected to a power source via a power supply pad to deliver the potential different from ground, for example.

In the example of FIG. 1, conductive track 122B is for example positioned at the level of an end of the other conductive tracks 121 which is most distant from analog circuit 150. Conductive track 122B is for example connected to power supply pad 134. This power supply pad 134 is configured to be optionally connected to a power source via a power supply pad to deliver the potential different from ground, for example.

In an example, the conductive tracks 110A, 110B, 112A, 112B of first and second grids 104A, 104B and/or the tracks 121, 122A, 122B of the conductive rail comprise copper or aluminum or a metal alloy.

In an example, the conductive tracks of first grid 104A and/or of second grid 104B and of conductive rail 120, arranged in the first level, have a greater thickness than the conductive tracks of the first grid and/or of second grid 104B and of conductive rail 120 arranged in the second level. Forming the conductive tracks 121 of conductive rail 120 in metal layers of significant thickness results in decreasing the resistance of these tracks. In another example, the thicknesses of the tracks of the first and second levels are similar.

The number of conductive tracks 110A, 110B, 112A, 112B, 121, 122A, 122B may be of from several tens to several thousands.

In the example of FIG. 1, conductive rail 120 is coupled to analog circuit 150 via one or a plurality of switches 140, for example, arranged in parallel, optional, configured to control the flowing of current between conductive rail 120 and analog circuit 150. For example, the one or a plurality of switches 140 are controlled by a control circuit (not illustrated) of electronic circuit boo. When the switch(es) are controlled to prevent the flowing of current, this enables to limit the power consumption. In the example of FIG. 1, the conductive track 121A of conductive rail 120 which is closest to power supply pad 132 and which is connected to power supply pad 134, is connected to switch 140. In an example, not illustrated, switch 140 is connected to any of conductive tracks 121. In an example, switch(es) 140 are transistors arranged in electronic circuit boo.

The vertical conductive tracks 121 of conductive rail 120 are electrically coupled in parallel, for example via conductive tracks 122A, 122B and vias 114. This enables to decrease the general resistance of conductive rail 120 between power supply pad 134 and analog circuit 150. In an example, the resistance of conductive rail 120 is in the range from 0.4 to 1.5 ohm.

The example of FIG. 1 enables to decrease the surface footprint of conductive rail 120 by interlacing conductive rail 120 with first grid 104A, by particularly using the spacings 102A of first grid 104.

Figure 2:
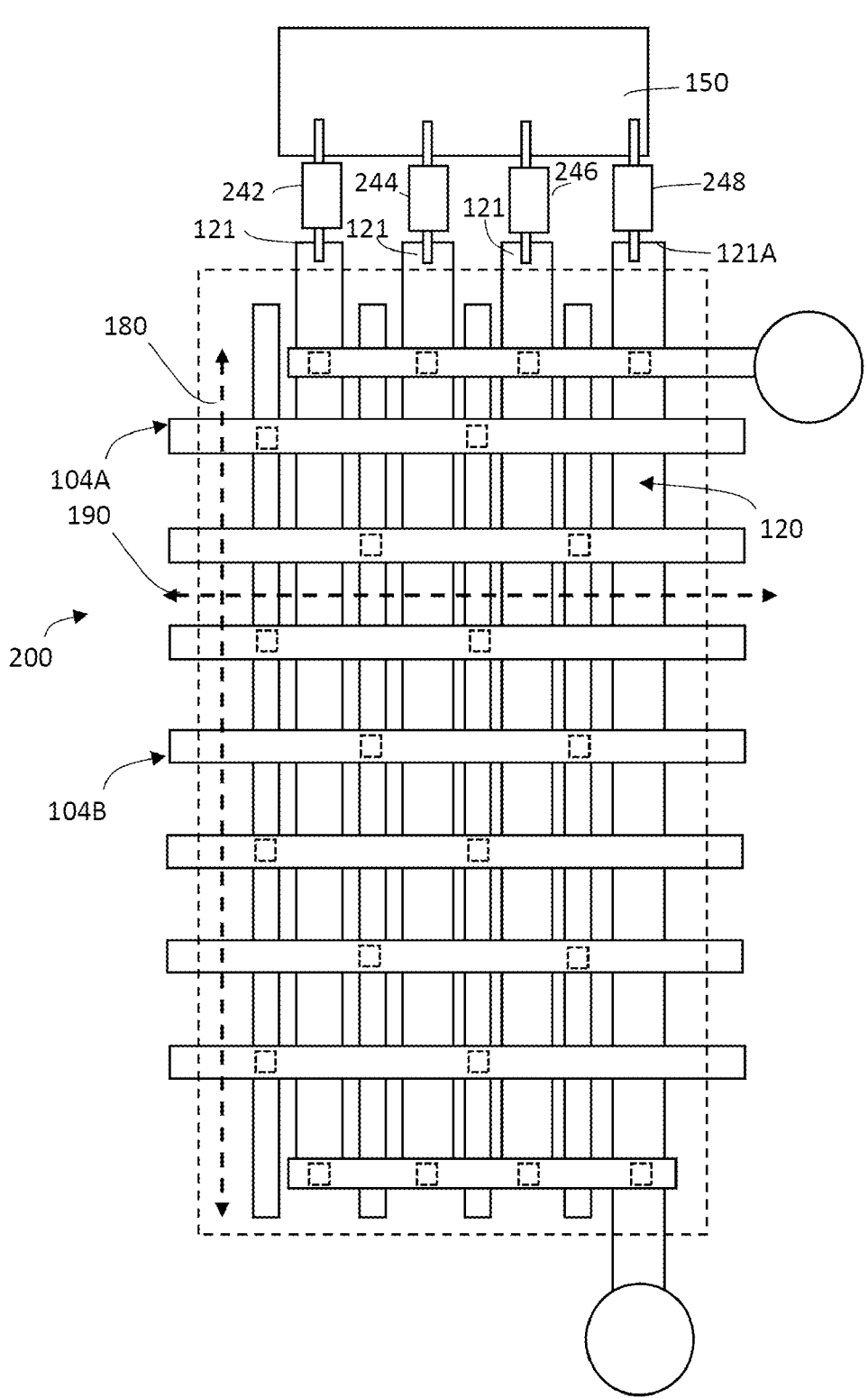
FIG. 2 is a simplified bottom view of an electronic circuit according to another embodiment of the present disclosure.

FIG. 2 is a simplified bottom view of an electronic circuit 200 according to another embodiment of the present disclosure.

The electronic circuit 200 of the example of FIG. 2 is similar to that of FIG. 1 except for switch 140, which is replaced, in the example of FIG. 2, by one or a plurality of switches 242, 244, 246, and 248 each arranged between an analog circuit 150 and a conductive track 121 different from conductive rail 120. In an example, at least two conductive tracks 121 different from conductive rail 120 are each coupled to a different switch. In another example, at least two switches are coupled to a same conductive track 121. Switches 242, 244, 246, and 248 are configured, for example, to control the flowing of current between conductive rail 120 and analog circuit 150. Switches 242, 244, 246, and 248 are controlled, for example, by a control circuit, not shown. Switches 242, 244, 246, and 248 enable to distribute the current at the output of conductive rail 120 and to form a switchable electric connection of relatively low resistance between conductive rail 120 and analog circuit 150.

Figure 3:
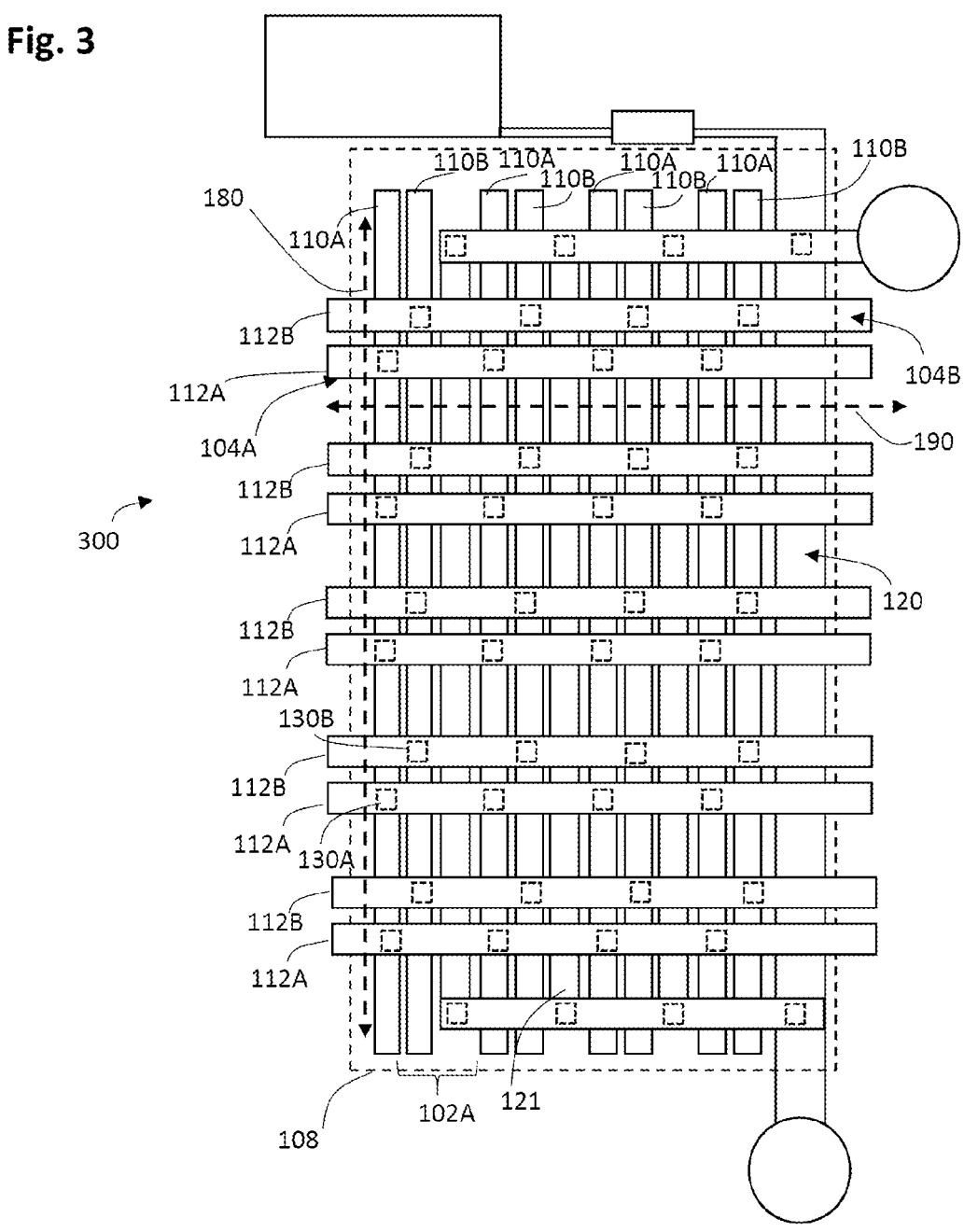
FIG. 3 is a simplified bottom view of an electronic circuit according to another embodiment of the present disclosure.

FIG. 3 is a simplified bottom view of an electronic circuit 300 according to still another embodiment of the present disclosure.

The electronic circuit 300 of FIG. 3 comprises first grid 104A and second grid 104B, which are similar to those of FIG. 1, except that only one of vertical tracks 121 of conductive rail 120 is arranged in each spacing 102A separating tracks 110A. In the example of FIG. 3, one of the vertical tracks 121 of conductive rail 120 is also arranged in each spacing 102A.

Figure 4:
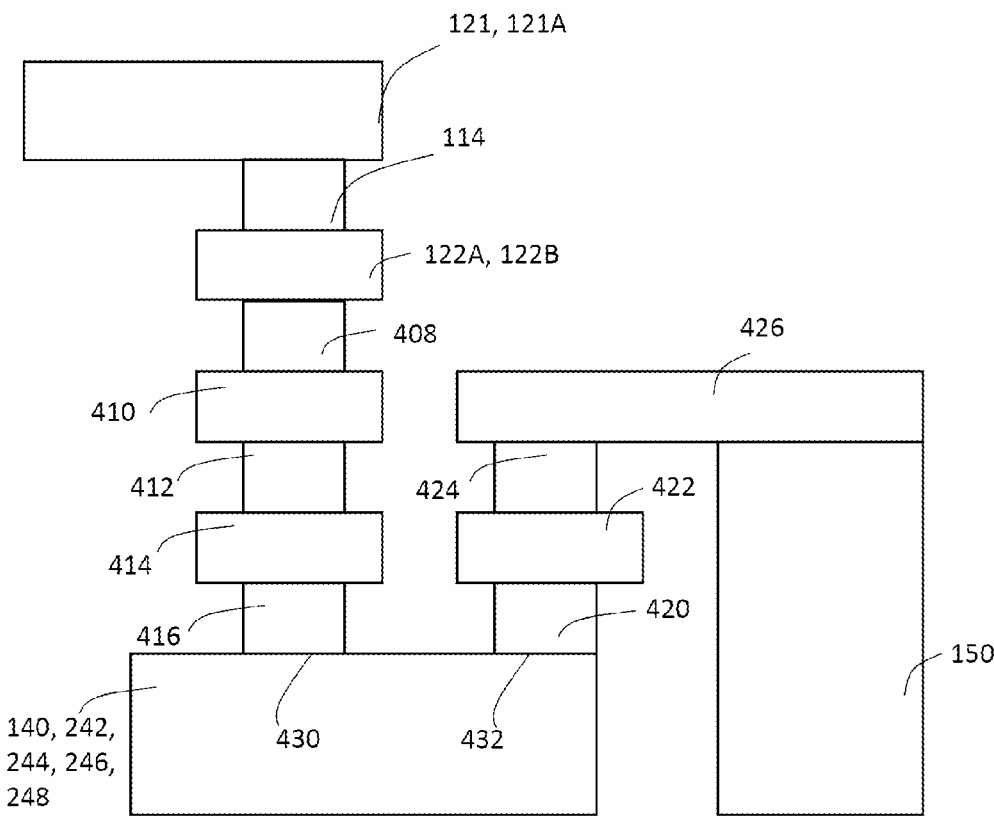
FIG. 4 is a simplified cross-section view of a portion of the electronic circuit comprising a switch according to an example of the present disclosure.

FIG. 4 is a simplified cross-section view of a portion of electronic circuit 100, 200, comprising one of switches 140, 242, 244, 246, or 248 according to an example of the present disclosure. Switch 140, 242, 244, 246, or 248 is arranged, for example, over a plurality of levels of electronic circuit 100, 200, 300 lower than the first and second levels, for example on levels with transistors.

In the example of FIG. 4, a terminal 430 of the switch is coupled to one of the conductive tracks 121, 121A of conductive rail 120 via a series of vias 416, 412, 408, 114, and their respective conductive tracks 414, 410, 122A, or

122B, which are stacked. In the example of FIG. 3, switches 140, 242, 244, 246, 248 occupy lower levels of the stacked metal tracks of the circuit, such as for example the three lower levels. Switches 140, 242, 244, 246, 248 also comprise, for example, MOS transistor formed inside and on top of a semiconductor substrate of the circuit (not illustrated in the drawings).

Terminal 430 is coupled to conductive track 414 by means of via 416. Conductive track 414 is coupled to the conductive track 410 of the upper level by means of via 412. Conductive track 410 is coupled to the conductive track 122A or 122B of the second level by means of via 410. Conductive track 122A or 122B is coupled to the conductive track 121A or 121 of the first level by means of vias 114.

In the example of FIG. 4, analog circuit 150 extends on the five lower levels of the stacked metal tracks of the circuit. The other terminal 432 of the switch is coupled to the conductive track 422 of the upper level by means of via 420. Conductive track 422 is coupled to the conductive track 426 of the level higher than that of track 422 by means of via 424. Conductive track 426 is coupled to a terminal of analog circuit 150 located, for example, on an upper surface of analog circuit 150.

In an example, analog circuit 150 extends from the lower levels of the stacked metal tracks, all the way to the fourth level, or to one of the upper levels, of the stacked metal tracks of the circuit, or extends from the lower levels of the stack metal tracks, all the way to the second level or all the way to the first level, of the stacked metal tracks of the circuit. In this case, those skilled in the art will adjust the number of necessary vias and conductive tracks.

Figure 5:
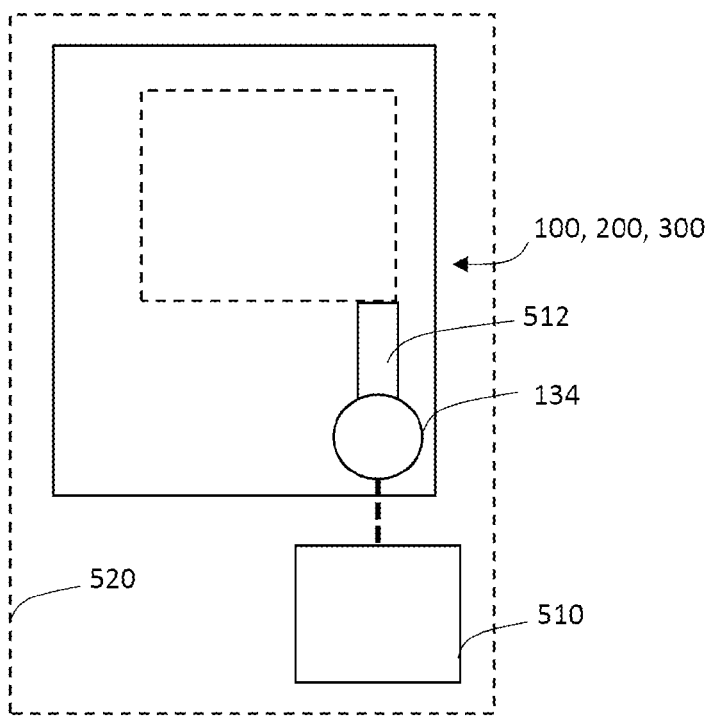
FIG. 5 shows a microcontroller according to an example of the present disclosure.

FIG. 5 shows an integrated circuit 520, such as a microcontroller, according to an example of the present disclosure. Integrated circuit 520 comprises electronic circuit 100, 200, or 300 as well as one or a plurality of power supply circuits 510 configured to apply the potential different from ground for example at the level of node 134. Node 134 is for example connected to electronic circuit 100, 200, or 300 by a conductive track 512. In another example, not illustrated, power supply circuit 510 is located outside of integrated circuit 520, that is, another integrated circuit, not shown, comprises power supply circuit 510 and delivers the bias potential.

Embodiments of the invention also bear on a method of manufacturing the electronic circuit 100, 200, or 300 of FIGS. 1, 2, and 3, the method comprising: the forming of first grid 104A configured to be biased with a potential different from ground, comprising conductive tracks 110A arranged in a first level of the electronic circuit and conductive tracks 112A arranged in at least a second level of the electronic circuit, the conductive tracks 110A arranged in the first level extending along a first direction 180 and being separated from one another by spacings 102A; and the forming of a conductive rail 120 coupling a first node and a second circuit by crossing the first grid 104A, the conductive rail being insulated from the first grid and configured to be biased with a potential different from ground, and comprising conductive tracks 121, 121A arranged in the first level of the electronic circuit along the first direction 180 and in the spacings 102A of the tracks of the first grid arranged in the first level.

Various embodiments and variants have been described. Those skilled in the art will understand that certain features of these various embodiments and variants may be combined, and other variants will occur to those skilled in the art. In particular, the example of FIG. 2 may be combined with the example of FIG. 3, for example, by using the switches 242, 244, 246, and 248 of FIG. 2 and by connecting them to the vertical tracks of the conductive rail 120 of FIG. 3. Those skilled in the art may envisage to implement grids additional to the first and second grids and insulated from the other grids to, for example, power the digital circuit with potentials or current different from those of the other grids.

One or a plurality of additional grids may be implemented similarly to the example of FIG. 1. For example, in the case of an additional grid, it may have an alternation, in a same level, of assemblies formed of a vertical track 110A of the first grid, of a vertical track of conductive rail 121, of a track 110B of the second grid, of another vertical track 121 of the conductive rail, of a vertical track of the additional grid, and of still another vertical track 121 of the conductive rail. In this case, additional horizontal tracks of the additional grid will be for example added in a different level and coupled by vias to the vertical tracks of the additional grid.

In another example, one or a plurality of additional grids may be implemented similarly to the example of FIG. 3. For example, in the case of an additional grid, it may have an alternation, in a same level, of assemblies formed of a vertical track 110A of the first grid, of a track 110B of the second grid, of a vertical track of the additional grid, and of a vertical track 121 of the conductive rail. In this case, additional horizontal tracks will be for example added in a different level and coupled by vias to the vertical tracks of the additional grid.

Finally, the practical implementation of the described embodiments and variations is within the abilities of those skilled in the art based on the functional indications given hereabove. In particular, the switches may be implemented by MOS transistors or by other types of transistors.

What is claimed is:

1. An electronic circuit comprising:
   a first grid configured to be biased with a potential different from ground, the first grid comprising conductive tracks arranged in a first level of the electronic circuit and conductive tracks arranged in a second level of the electronic circuit, wherein the first grid is configured to power a first circuit at least partially implemented in a level arranged below the first and second levels, and wherein the conductive tracks are arranged in the first level extending along a first direction and being separated from one another by spacings; and
   a conductive rail coupling a first node and a second circuit by crossing the first grid, wherein the conductive rail is insulated from the first grid and configured to be biased with a potential different from the ground, and wherein the conductive rail comprises conductive tracks arranged in the first level of the electronic circuit along the first direction and in the spacings of the conductive tracks.

2. The circuit according to claim 1, wherein the second circuit is an analog circuit of the electronic circuit.

3. The circuit according to claim 2, wherein the conductive rail is coupled to the analog circuit via one or more switches configured to control a current flow between the conductive rail and the analog circuit.

4. The circuit according to claim 3,
   wherein the analog circuit is coupled to a terminal of the one or more switches arranged in another level of the electronic circuit different from the first level and the second level, and
   wherein another terminal of the one or more switches is coupled to the conductive tracks of the conductive rail.

5. The circuit according to claim 2, wherein one of the conductive tracks of the conductive rail closest to the analog circuit, is coupled to a power supply configured to deliver the potential different from the ground via a power supply pad.

6. The circuit according to claim 5, wherein one of the conductive tracks of the conductive rail most distant from the analog circuit is coupled to the power supply configured to deliver the potential different from the ground via the first node.

7. The circuit according to claim 6, wherein a resistance of the conductive rail is in a range from 0.4 to 1.5 ohms.

8. The circuit according to claim 1,
   wherein the conductive tracks of the first grid, arranged in the first level, are coupled via one or a plurality of vias to the conductive tracks of the first grid arranged in the second level, and
   wherein the conductive tracks of the conductive rail, arranged in the first level, are coupled via one or more vias to conductive tracks of the conductive rail arranged in the second level.

9. The circuit according to claim 1,
   wherein the conductive tracks of the first grid arranged in the second level extend along a second direction traversing the first direction, and
   wherein the conductive tracks of the first grid are coupled via one or more vias to the conductive tracks of the first grid arranged in the first level.

10. The circuit according to claim 9,
    wherein the electronic circuit comprises a second grid configured to be grounded when the first grid is biased with the potential different from ground or configured to be biased to the potential different from ground when the first grid is grounded,
    wherein the second grid comprising conductive tracks arranged in the first level extending along the first direction in the spacings between the conductive tracks of the first grid arranged in the first level along the first direction,
    wherein the second grid comprises conductive tracks arranged in the second level of the electronic circuit extending along the second direction, and
    wherein the conductive tracks of the second grid arranged in the first level are coupled to the conductive tracks of the second grid arranged in the second level via one or more vias.

11. The circuit according to claim 10, wherein the conductive tracks of the first and second grids and of the conductive rail, arranged in the first level, have a greater thickness than the conductive tracks of the first and second grids and of the conductive rail arranged in the second level.

12. The circuit according to claim 11, wherein the conductive tracks of the first and second grids and of the conductive rail are made of copper.

13. A method comprising:
    forming a first grid configured to be biased with a potential different from ground, the first grid comprising conductive tracks arranged in a first level of an electronic circuit and conductive tracks arranged in a second level of the electronic circuit, wherein the first grid is configured to power a first circuit at least partially implemented in a level arranged under the first and second levels, and wherein the conductive tracks are arranged in the first level extending along a first direction and being separated from one another by spacings; and
    forming a conductive rail coupled between a first node and a second circuit by crossing the first grid, insulated from the first grid and configured to be biased with a potential different from the ground, the conductive rail comprising conductive tracks arranged in the first level of the electronic circuit along the first direction and in the spacings of the conductive tracks.

14. The method according to claim 13, wherein the second circuit is an analog circuit of the electronic circuit.

15. The method according to claim 14, further comprising coupling the conductive rail to the analog circuit via one or more switches, the switches configured to control a current flow between the conductive rail and the analog circuit.

16. The method according to claim 15, further comprising:

coupling the analog circuit to a terminal of the one or more switches formed in another level of the electronic circuit different from the first level and from the second level; and coupling the conductive tracks of the conductive rail to another terminal of the one or more switches.

17. The method according to claim 13, further comprising:

coupling, by one or more vias, the conductive tracks of the first grid, arranged in the first level, to the conductive tracks of the first grid, arranged in the second level; and coupling, by one or more vias, the conductive tracks of the conductive rail, arranged in the first level, to conductive tracks of the conductive rail, arranged in the second level.

18. An electronic circuit comprising:

a first grid configured to be grounded, the first grid comprising conductive tracks arranged in a first level of the electronic circuit and conductive tracks arranged in a second level of the electronic circuit, wherein the first grid is configured to power a first circuit at least partially implemented in a level arranged below the first and second levels, wherein the conductive tracks are arranged in the first level extending along a first direction and being separated from one another by spacings; and a conductive rail coupling a first node and a second circuit by crossing the first grid, the conductive rail being insulated from the first grid and configured to be grounded, wherein the conductive rail comprises conductive tracks arranged in the first level of the electronic circuit along the first direction and in the spacings of the conductive tracks.

19. The circuit according to claim 18, wherein the second circuit is an analog circuit of the electronic circuit.

20. The circuit according to claim 19, wherein one of the conductive tracks of the conductive rail, closest to the analog circuit, is coupled to a power supply configured to deliver a potential different from ground via a power supply pad, wherein another one of the conductive tracks of the conductive rail, most distant from the analog circuit, is coupled to the power supply configured to deliver the potential different from ground via the first node, and wherein a resistance of the conductive rail is in a range from 0.4 to 1.5 ohms.

* * * * *